(12) United States Patent
Bierhoff et al.

(10) Patent No.: US 6,852,982 B1
(45) Date of Patent: Feb. 8, 2005

(54) MAGNETIC LENS

(75) Inventors: Martinus Petrus Maria Bierhoff, Deurne (NL); Cornelis Sander Kees Kooijman, Veldhoven (NL); Colin August Sanford, Atkinson, NH (US)

(73) Assignee: FEI Company, Hillsboro, OR (US)

( * ) Notice: Subject to any disclaimer, the term of this patent is extended or adjusted under 35 U.S.C. 154(b) by 4 days.

(21) Appl. No.: 10/621,103

(22) Filed: Jul. 14, 2003

(51) Int. Cl.[7] .................. H01J 37/141; H01J 37/14

(52) U.S. Cl. .................. 250/386 ML; 250/396 R; 250/397; 250/306; 250/307; 250/310

(58) Field of Search .................. 250/396 ML, 396 R, 250/397, 306, 307, 310

(56) References Cited

U.S. PATENT DOCUMENTS

| | | | | |
|---|---|---|---|---|
| 4,345,152 A | * | 8/1982 | Gerlach | 250/396 ML |
| 6,051,839 A | * | 4/2000 | Crewe | 250/396 ML |
| 6,515,287 B2 | * | 2/2003 | Notte, IV | 250/396 ML |

OTHER PUBLICATIONS

J. B. Pawley, "Use of Pseudo–Stereo Techniques to Detect Magnetic Stray Field in the SEM", *Scanning* vol. 9 pp. 134–136, (1987).

* cited by examiner

*Primary Examiner*—Nikita Wells
(74) *Attorney, Agent, or Firm*—Michael O. Scheinberg

(57) ABSTRACT

In one embodiment of the present invention, a magnetic lens is provided that can generate a substantially constant amount of average heat power over a pre-selected range of resultant magnetic field strengths. The lens is configured to do this with multiple, asymmetric (different turns) coil sections that can produce a desired range of field strengths, and at the same time, maintain a sufficiently constant temperature signature when the average total power is maintained constant thereby eliminating unreasonable delays in lens operation when the resultant field strength is changed. The asymmetric lens structure allows for the smaller coil to be made with less relative inductance thereby making it more responsive and amenable for an AC drive signal and thus dynamic focusing applications if desired. Thus, a magnetic lens is now provided that can produce a range of magnetic beam-focusing field strengths, implement dynamic focusing, and not impose unreasonable delay for thermal stabilization between changes in magnetic field strength.

22 Claims, 6 Drawing Sheets

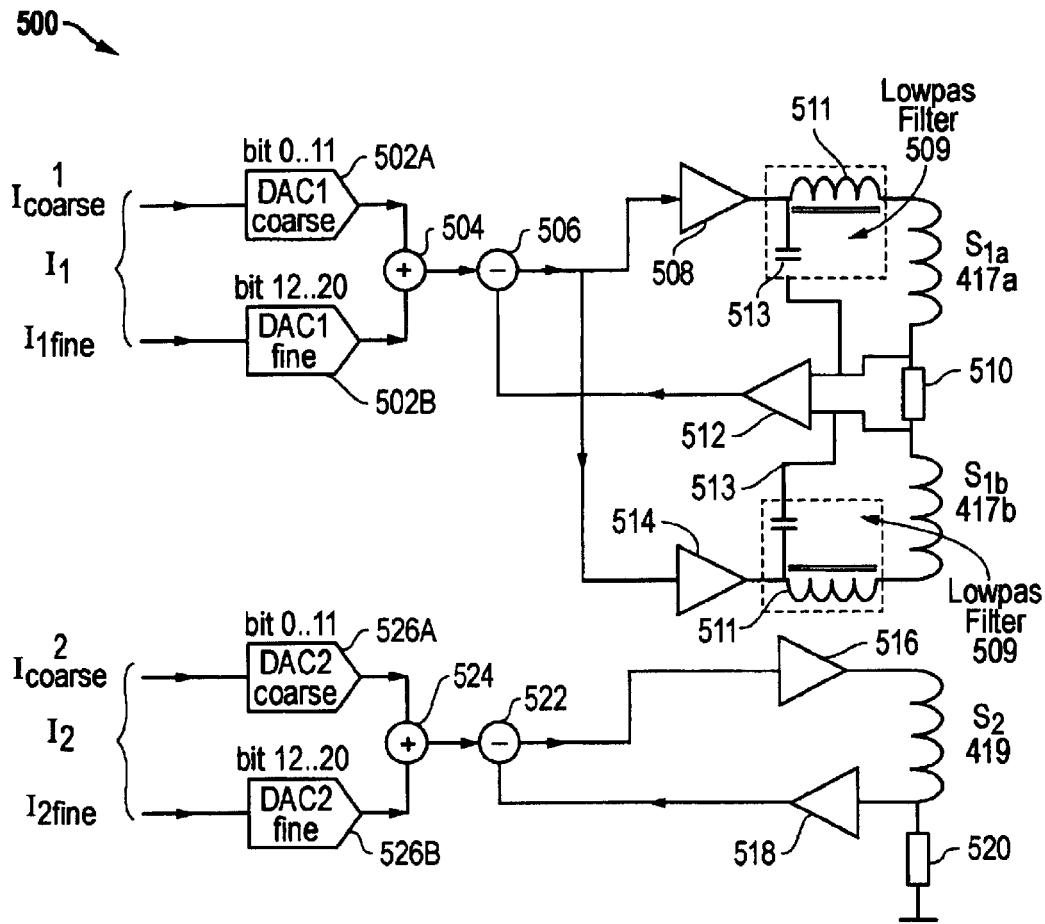
*FIG. 5*
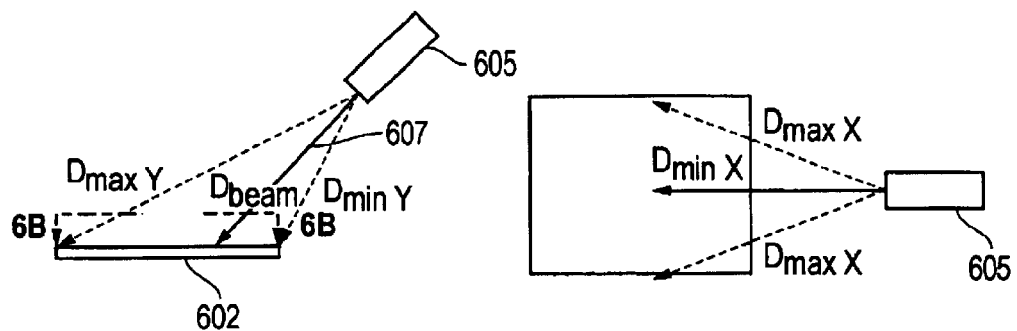
*FIG. 6A*  *FIG. 6B*

MAGNETIC LENS

TECHNICAL FIELD OF THE INVENTION

The present invention generally relates to a magnetic lens and, in particular, relates to a magnetic lens having thermal power dissipation independent of the strength of its magnetic field.

BACKGROUND OF THE INVENTION

Magnetic lenses are generally known and are often employed to focus a beam of charged particles e.g., electrons. One major use of a magnetic lens is in analytical instruments such as electron microscopes, which utilize focused electron beams to stimulate a reaction from a sample that is being observed or analyzed. In such instruments the magnetic lens is useful as an objective, or final focusing lens. That is, the objective magnetic lens is the last focusing element prior to the beam impinging on the sample. As such, the stability of the beam position as affected by the magnetic lens is quite critical to achieve an accurate characterization of small features on the sample.

FIG. 1 is a cross-sectional, schematic drawing of a conventional magnetic lens assembly 100. Lens assembly 100 includes upper section 110 (which comprises an electron detector assembly), coil 115, and pole assembly 120, which includes upper pole piece 122, outer pole piece 24, inner pole piece 126, cooling ring 127, and insulator 129. Substantially collaring the ring-shaped coil 115, the pole pieces form a magnetic circuit around the coil for carrying magnetic flux when current flows through the coil. An air gap 131 proximal to the sample to be analyzed is disposed between the inner and outer pole pieces 124, 126. The centerline of the lens corresponding to the beam path is indicated at 105. The primary electrons are focused by the magnetic field B at the end of the lens near the air gap. Because the air gap 131 has significantly higher reluctance than the combined pole pieces, "fringing" occurs at the air gap causing the magnetic field B to bow, as shown, toward the sample in a desired annular shape for focusing incoming electrons approaching the sample.

One feature of conventional analytical instruments employing an electron beam is that the energy of the electron beam is variable over a range of energies consistent with the range of materials to be characterized. For example, in an Auger analysis, the energy of the electron beam determines the depth of penetration and the range of Auger excitation of the atoms of the sample. Since the energy necessary to produce Auger electrons varies from atom to atom, a beam generator, to be effective, should be capable of producing electrons of various energies. In addition, the beam energy should be variable when the sample under analysis is an insulator because if the beam energy is high enough, the sample can become electrostatically charged. Such charging can be avoided by reducing the beam energy, sometimes to as low as 0.5 KeV. Another instance that mandates a variable beam energy is where an X-ray detector is used. In order to produce atomic emissions in the X-ray spectrum, the energy of the charged particle beam must be quite high, for example, on the order of about 30 KeV. Thus, to be practical, the energy of the electron beam should be variable over a broad energy range. As one might expect, however, when the beam energy or beam size is changed, the strength of the lens magnetic field typically must also be adjusted in order to ensure that the beam having the changed energy remains focused on the same point of the sample as the beam of previous energy.

The magnitude of the magnetic field generated by the lens 100 is proportional to the number of coil-turns multiplied by the current in the coil 115 (measured in amp-turns, At). Thus, by changing the current in the coil, one can vary the value of the magnetic field to match the energy of the beam. However, because the lens coil is typically made of wire, which has electrical resistance, electrical power (heat) is generated in the coil. (The amount of power $P = R \cdot I^2$). For example, in a typical coil, 1140 Amp-turns may be required. This can translate to about 15.5 W, which is a significant amount of heat, especially to be dissipated in the confined environment of a magnetic lens coil. The heat emitted from the lens coil will raise the temperature in the lens pole assembly, which causes it to expand. (Likewise, a decrease in field strength causes the temperature to fall and the pole assembly to contract.) This is problematic because the exact position of the lens pole pieces with respect to each other and the centerline of the electrons define the position where the electrons are focused on the specimen. Thus, changes in field strength affect the focusing characteristics of the lens coil. This can impose a delay in operating the device after changing the field strength so that the lens coil has sufficient time (e.g., one to seven hours) to thermally stabilize. Accordingly, a major consideration in designing a magnetic lens is the removal and dissipation of the thermal power generated by it in order to speed up this delay. Unfortunately, the reaction times of available thermal dissipation mechanisms are typically inadequate to readily keep pace with thermal changes caused by changing the strength of the magnetic field. While the delay may be decreased, time must still be wasted waiting for the lens to "settle."

One solution has been to use a multi-coil design that generates constant heat power over the operating magnetic-field strength range. Such a design is shown in U.S. Pat. No. 4,345,152 to Gerlach, which is hereby incorporated by reference into this specification. The lens is composed of a pair of sub-coils substantially in parallel with a common terminal. They are configured so that the currents travel in opposite directions around a common core. This is achieved with a pair of adjacent, but electrically insulated conductors wrapped in tandem (bi-filair) around the core. The magnetic fields created by each coil are proportional to their respective currents but offset one another since they have oppositely directed currents. In turn, their generated magnetic fields effectively offset each other. The overall lens field strength is minimized when their magnitudes are the same, while the overall field strength increases as the difference between the individual current magnitudes increases, but the power generated by each coil is simply a function of the magnitude of its current squared. Thus, by varying the subcoil current difference but keeping constant the sum of their $I^2R$ magnitudes, the generated power can be held constant while the effective lens magnetic field strength is varied. Unfortunately, one drawback with this approach is that the overall response of the magnetic lens is fairly slow. That is, in order to attain the desired range of magnetic field strengths, both coils have a significant number of turns thereby giving them relatively large self-inductances. In fact, they can be large enough to inhibit field strength changes that are fast enough for such practices as dynamic focusing.

Accordingly, what is needed is an improved magnetic lens that can remain thermally stable and at the same time be sufficiently responsive over a range of operating magnetic field strengths.

SUMMARY OF THE INVENTION

In one embodiment of the present invention, a magnetic lens is provided that can generate a substantially constant amount of average heat power over a pre-selected range of resultant magnetic field strengths. The lens is configured to do this with multiple, asymmetric (different turns) coil sections that can produce a range of desired field strengths, and at the same time, maintain a sufficiently constant temperature signature when the average total power is maintained constant thereby eliminating unreasonable delays in lens operation when the resultant field strength is changed over the operating range of field strengths. The asymmetric lens structure allows for the smaller coil to be made with less relative inductance thereby making it more responsive and amenable for AC signal driving and thus dynamic focusing applications if desired. Thus, a magnetic lens is now provided that can produce a range of magnetic beam-focusing fields strengths, implement dynamic focusing, and not impose unreasonable delay for thermal stabilization between changes in magnetic field strength.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes as the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, the following description is made with reference to the accompanying drawings, in which:

FIG. 5 is an electrical schematic diagram of a circuit for driving the multi-coil assembly of FIGS. 4A–4C.

FIG. 6A is a block diagram of an SEM beam length for different scan angles in an SEM.

FIG. 6B is a top view of the block diagram of FIG. 6A taken along lines 6B–6B.

DETAILED DESCRIPTION OF THE PREFERRED EMBODIMENTS

Overview

The present invention provides improved multi-coil designs for magnetic lens applications. The improved lens coil is not only capable of dissipating substantially constant power over a range of operating magnetic field strengths, but also, it is responsive enough to be driven with a modulated current for dynamic focusing applications. While the multi-coil lens may be used in a variety of applications, it is well suited as an objective lens for a scanning electron microscope ("SEM") in a dual beam system because its magnetic field strength can be adjusted without requiring excessive set-up time for thermal stabilization.

Figure 2:
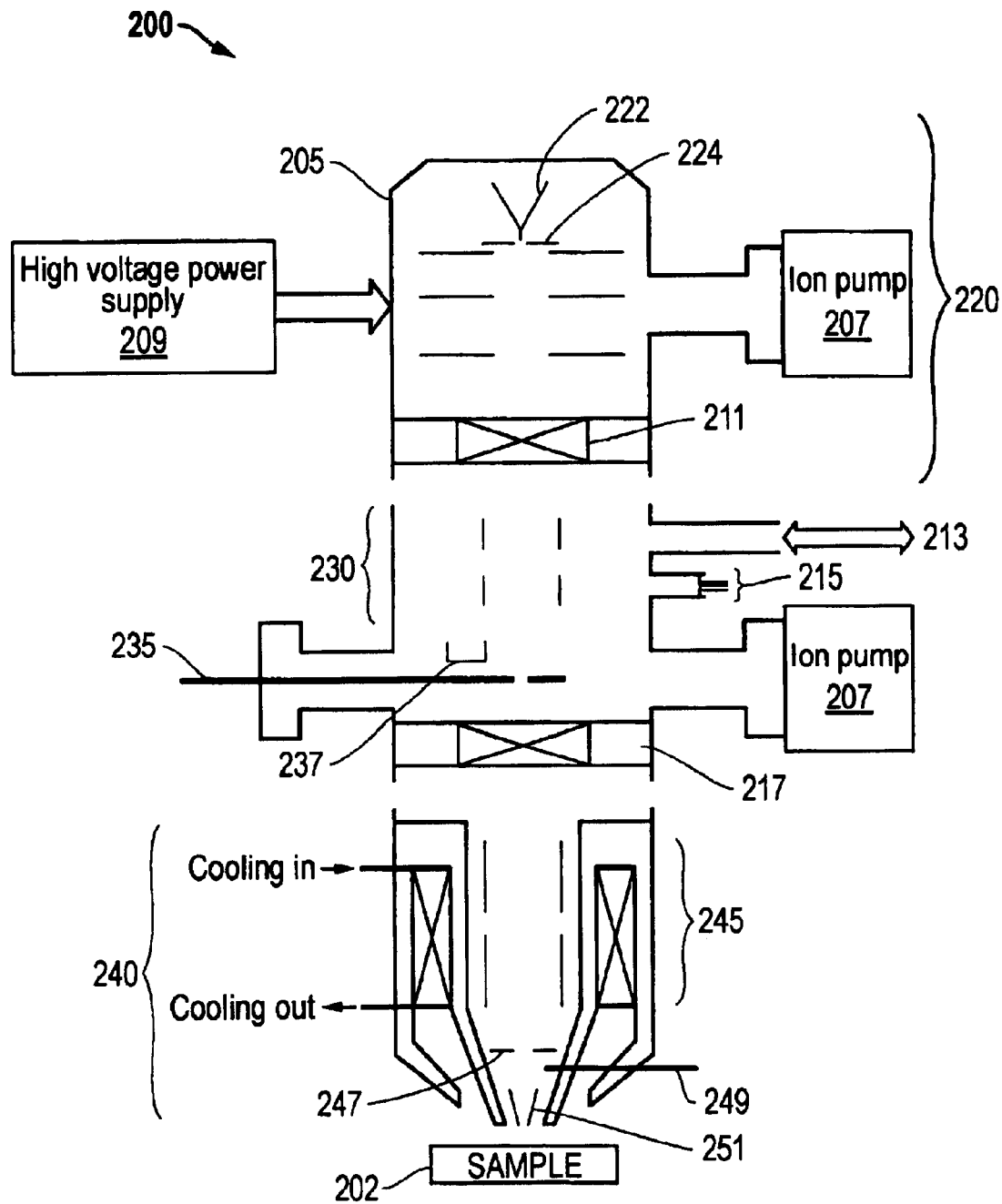
FIG. 2 is a schematic view of a scanning electron microscope utilizing an embodiment of a magnetic lens of the present invention.

FIG. 2 schematically shows an SEM column 200 employing one embodiment of a multi-coil magnetic lens of the present invention. The SEM 200 provides a magnified image of a sample 202. It generally includes column housing 205, electron beam source 220, electrostatic alignment electrodes 230, aperture 235, blank beam dump device 237, multi-cod objective lens assembly 240, deflector 245, mirror electrode 247, light pipe 249, and "suck" tube 251. The electron beam source 220 includes electron source 222 and beam limiting aperture 224, which limits the outer portion of the electron beam for reducing optical aberrations. The electron beam source generates an electron beam that is directed down the central axis of the column toward sample 202. The blank beam dump 237 is connected to an electronometer for controlling and monitoring the size of the electron beam current applied to the sample 202.

The beam is aligned toward the center axis with electrostatic alignment electrodes 230 and electrostatic deflectors 245, which also steer the beam for scanning the sample. The alignment electrodes incorporate electrostatic quadrupoles, which can be individually driven, for aligning the beam. Similarly, the deflector 245 utilizes electrostatic octopoles that are individually driven and are also used for image shift and stagmation control.

In the depicted embodiment, the multi-coil lens assembly 240 comprises a bi-furcated primary coil with an inner-disposed, smaller second coil for, among other things, generating a dynamic focusing field component. The multi-coil lens generates a desired magnetic field within a range of operation magnetic field strengths at substantially constant power dissipation. The lens assembly also includes cooling components to assist in maintaining the lens structure thermally stable. Objective lens 240 creates a focusing magnetic field proximal to the sample 202 at the downstream end of the lens assembly for focusing (e.g., de-magnifying) the electron beam just before it reaches the sample.

Also included in the SEM column housing 205 are ion pumps 207 for evacuating the column, a high voltage power supply 209 for energizing the electron source 220, and a chamber isolation valve 211 disposed midway down the column housing 205 for sealing the electron source 220 from the rest of the housing and/or operating environment when the SEM is not active. The valve includes a sensor for confirming that the valve is opened or closed. Column housing 205 also has a high vacuum vent 213 for evacuating the chamber, and electrical feed-throughs 215 for electrically connecting the various components through the sealed vacuum housing.

Constant Power Magnetic Field Analysis

Before describing specific lens structures, theoretical aspects of the constant power approach will initially be discussed. A multi-coil magnetic lens has two or more coils disposed about a common core. This results in the overall resultant lens field to be a sum of the constituent individual coil fields. The magnetic field in a coil is proportional to the coil current and the number of turns of the coil:

$$B \propto n \cdot I$$

where B is the magnetic field produced by the coil, n is the number of coil turns, and I is the current in the coil. (The letter S is used to connote a coil.) Thus, with multiple coils sharing a common core and each having $n_i$ turns, the magnetic field is given by the summation of the contribution of each coil:

$$B_{tot} = n_1 \cdot I_1 + n_2 \cdot I_2 + \ldots + n_i \cdot I_i$$

The power dissipation in an individual coil section is given by:

$$P_i = R_i \cdot I_i^2$$

where R is the resistance in the coil section. As with the magnetic field, the total power in the multi-coil is the sum of the individual coil section power components. Thus, for a multi-coil:

$$Ptot = R_1 I_1^2 + R_2 I_2^2 + \ldots + RN \cdot IN^2$$

For a multi-coil lens of the present invention, it is desirable for the coil temperatures to be as close to each other as possible and to have a fairly constant temperature signature over the operational range of magnetic field strengths without imposing an unreasonable delay between field strength changes. Certain design strategies, as will be discussed below, can be employed to achieve this objective. Thus, for this analysis, it is assumed that the coil temperatures are equal. In addition, to simplify the analysis, it is also assumed that the wire used in each coil is the same (i.e., same material, same diameter). It is also assumed that the coil sections have the same mean diameters. (As will be demonstrated below, this can occur with a bi-furcated first coil and an inner-disposed second coil.) These conditions are reasonable for implementations of the present invention but certainly not required for all designs. They do, however, simplify the analysis and teaching of the invention. With these assumptions, the electrical resistance in each coil is proportional to the number of turns, or:

$$R_i \propto n_1$$

It then follows that:

$$P_{II} \propto n_1 \cdot I_1^2 + n_2 \cdot I_2^2 + \ldots + n_i n I_n^2$$

where $P_{II}$ is the total power generated in the coil. (The symbol "II" represents the lens multi-coil.)

Two Coil Assembly

The following analysis pertains to a lens with two coils, $S_1$ and $S_2$ and assumes that both coils have the same mean diameter, wire parameters, and temperature. The total magnetic field and power generated in the coil are proportional to the sums of the individual coil section components, or:

$$B_{II} \propto n_1 \cdot I_1 + n_2 \cdot I_2$$

and $$P_{II} \propto n_1 \cdot I_1^2 + n_2 \cdot I_2^2$$

Since $B_{II}$ is an odd function of $I_2$ and $P_{II}$ is an even function of $I_2$, by varying $I_2$ over a range of negative and positive values, it is possible to vary the magnetic field generated by the coil while keeping the dissipated power in the lens coil constant. (One could also vary $I_1$, along with $I_2$, in both directions to achieve an even wider range of magnetic field strengths, but in this analysis, the magnitude of $I_1$ is kept positive while $I_2$ is allowed to be adjusted between positive and negative values. However, the present invention is certainly not limited to such a constraint.) The magnetic field $B_1$ determined by uni-directional current $I_1$ in coil $S_1$ is augmented or offset by the magnetic field $B_2$ generated in the second coil, depending on the direction of $I_2$, while the total power created by both sections is kept constant. (Power, of course, is a function of the constituent current magnitudes but is independent of their directions.) Thus, the magnetic field in the objective lens can be changed without having to change the total dissipated power in the lens coil. The average dissipated power is kept constant over the entire range of operational magnetic fields such that:

$$P_{IIc} = n_1 I_1^2 + n_2 I_2^2 = k$$

Thus, with a defined total dissipated power, $P_{IIc}$, one can maintain this power by varying the constituent current components to achieve the desired total magnetic field while ensuring that they satisfy the constant power, elliptical function. It is recognized that the value of k (or $P_{IIc}$) can be set at any suitable value. However, for simplicity, the value of k will be assumed to be 1. That is, the constant power function in this discussion is normalized to a value of 1. (Persons of skill, however, will understand how to translate between actual and normalized values.)

Magnetic Field Range

The values of $I_1$ and $I_2$ can be determined for maximizing the available magnetic field, $B_{IIc}$, under the design constraints discussed above. This is done by taking the derivative of the magnetic field function and setting it equal to zero. This results with maximum magnetic field occurring at:

$$I_2 = I_1$$

The minimal magnetic field, with $I_1$ kept positive, occurs with $I_1$ minimized and $I_2$ maximized (in the negative direction) along the constant power curve. However, in order to enhance thermal stability, it is desirable to maintain the power densities in each coil section within an acceptable range of one another. Power density, D, is defined as power per unit length of wire in a coil section. The power densities affect each coil's ability to sufficiently dissipate its power, relative to the other coil, and thereby maintain thermal stability. Accordingly, in this analysis, another self-imposed constraint is that each coil section should have the same maximum power density. IF n1 equals n2 (and both coils have the same wire characteristics), this condition is automatically satisfied, and so the minimal magnetic field occurs with $I_1$ equal to zero and $I_2$ equal to −1 (again, using the normalized power function). However, with $n_1 > n_2$, it occurs at $I_2$ equal to −$I_2$(at $B_{max}$). This is because along the constant power function, $I_2$ will always have a higher power density, so its maximum power density corresponds to the maximum power density for $I_2$. With this in mind, from the above equations:

$$I_{1max} = I_{2max} = -\sqrt{(n_2/n_1)}$$

so $$P_{1Bmin} = 1 - n_2/n_1$$

and thus, $$I_{1Bmin} = \sqrt{((n_2 \cdot (n_1 - n_2))/n_1^2)}$$

and $$B_{IIcmin} = (n_1/n_2) \cdot I_{1Bmin} + I_{2max} = \sqrt{((n_1 - n_2)/n_2)} - \sqrt{(n_2/n_1)}$$

Again, with $B_{max}$ occurring at $I_{1max} = I_{2max} = -\sqrt{(n_2/n_1)}$, then:

$$B_{IIcmax} = (n_1/n_2) \cdot I_{1Bmax} + I_{2Bmax} = \sqrt{((n_1 + n_2)/n_2)}$$

Accordingly, the magnetic field range under these conditions is:

$$\sqrt{((n_1-n_2)/n_2)} - \sqrt{(n_2/n_1)} < B_{IIc} < \sqrt{((n_1+n_2))/n_2)}$$

From the above, the following general observations can be made. AS $n_1$ increases relative to $n_2$, the fluctuations in coil section power density decreases. Conversely, as $n_1$ gets larger relative to $n_2$, the B range decreases. Accordingly, a compromise between these parameters is generally desired. That is, one looks for a solution with a sufficiently high B range but with a minimal power density fluctuation between the two coils over the operational range of magnetic fields.

Figure 3A:
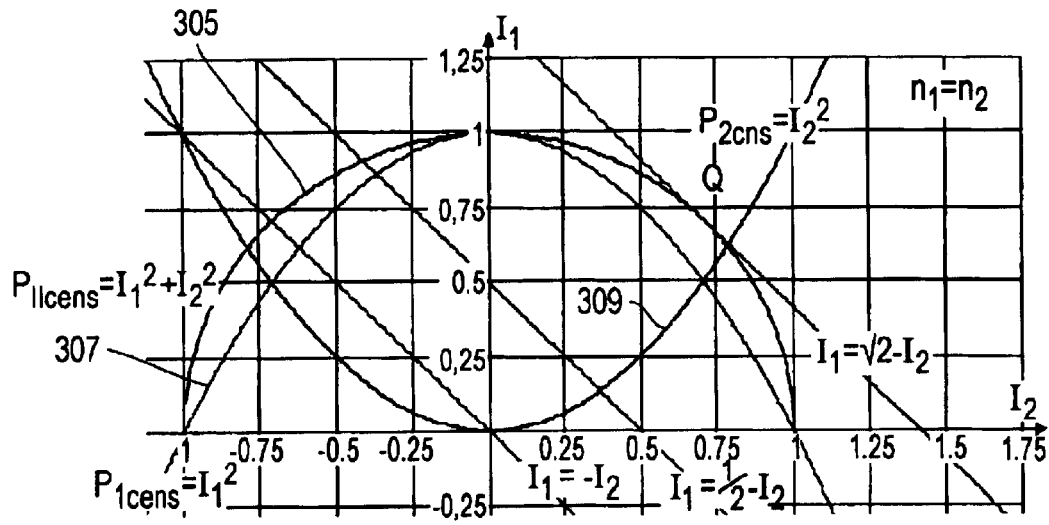
FIGS. 3A–3C show constant power graphs for different multi-coil lens structures of the present invention.
Figure 3B:
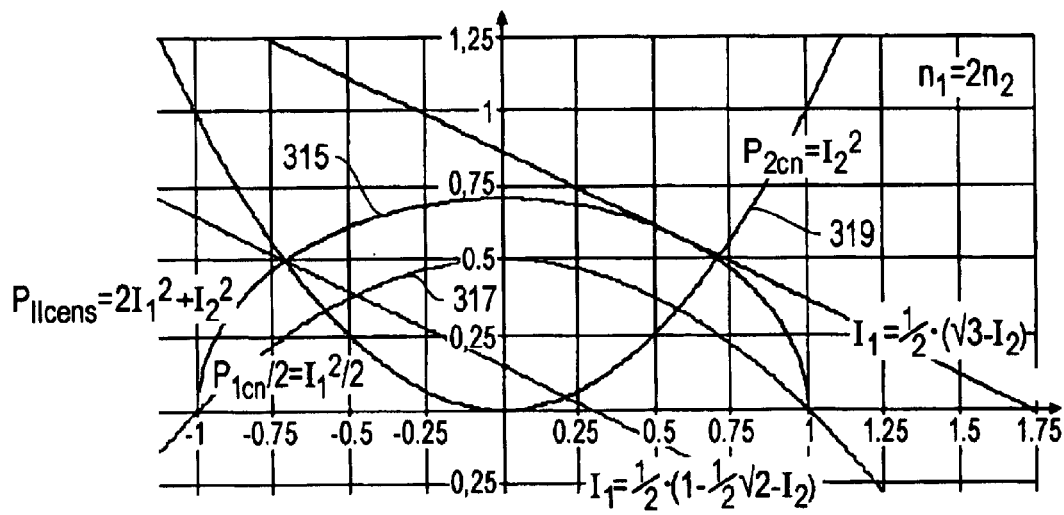
Figure 3C:
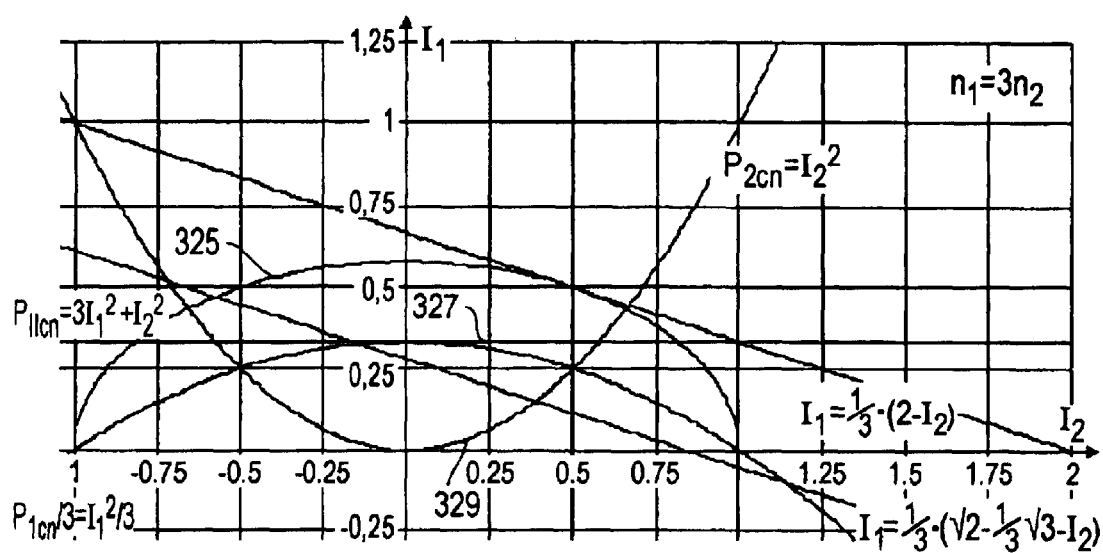

With reference to FIGS. 3A–3C, three specific cases: $n_1=n_2$, $n_1=2n_2$, and $n_1=3n_2$, are examined. In these examples, the above discussed conditions are assumed.

Case 1: $n_1=n_2$

FIG. 3A shows the case for $n_1=n_2$. Illustrated is constant power curve 305 for the normalized case of $n_1=n_2$. It identifies values for $I_1$ and $I_2$ in relation to each other. Curve 307 shows the power, $P_{1cns}$, dissipated in the first coil, and curve 309 shows the power, $P_{2cns}$, dissipated in the second coil. Only the positive side of the constant power curve 305 is depicted because, again, the primary coil current, $I_1$, is uni-directional. All points on curve 305 satisfy the stipulation of a normalized constant power of one. By knowing either $I_1$ or $I_2$, the value of the other current can be determined by solving the equation:

$$B_{II} \propto I_1+I_2, \text{ or } I_1=B_{II}-I_2$$

(This results from the $n_1$ and $n_2$ variables canceling out since they are equal to one another.) This equation defines a straight line with a slope of −1. Depending on the values of $I_1$ or $I_2$, this line will be shifted, respectfully, along the y or x axis. The maximum magnetic field I($I_1=I_2$) is indicated at the point, Q, on the constant power curve 305 with $I_1=I_2=1/\sqrt{2}$ (or 0.707). Also the power dissipated in each section is depicted.

Since the power is kept constant, all the power will be dissipated in coil section $S_1$, when $I_2$ becomes zero. The power-density $D_1$ in coil section $S_1$ doubles. Thus, the desire of equal temperature of both coil sections is hardly fulfilled, especially when the coil sections S1 and S2 are not biflair wound. (Biflair wound means that the wires from each coils are wound together in tandem.) While such a design would be suitable in some cases, it unfortunately can be difficult to manufacture. One way of addressing this problem is to employ the above-discussed constraint that the maximum power densities in each coil are the same. Under this condition, when $n_1=n_2$, the range of the magnetic field would be:

$$-1<B_{II}<\sqrt{2}$$

Case 2: $n_1=2n_2$

FIG. 3B shows the case for $n_1=2n_2$. Curve 315 is the constant power curve for this case. Curve 317 shows the power, $P_{1cns}$, dissipated in the first coil section, and curve 309 shows the power, $P_{2cns}$, dissipated in the second coil. Again, only the positive side of the constant power curve 315 is depicted because, for this embodiment, it is a design constraint that $I_1$ is uni-directional. All points on this curve satisfy the relation of a constant power of 1. By changing $I_1$ or $I_2$, the new value of the other can be found at the interception of the changed value on the curve.

The maximum magnetic field along the constant power curve 315 occurs if $I_2=I_1=\sqrt{3}/3$ (or 0.577). This corresponds to a magnetic field, $B_{II}$, of $2/\sqrt{3}+1/\sqrt{3}$, which is equal to $\sqrt{3}$. Because n1 has twice as many turns as n2, coil S1 has the smallest maximum power density. Therefore, to comply with the criteria that the coil sections should have the same maximum power densities, their power densities are constrained to $D_{1max}$, (at $I_2=0$), which equals ½. Therefore, the minimal magnetic field, $B_{II}$, occurs at $I_2=-1/\sqrt{2}$. This corresponds to $I_1$ equal to ½. At this point, $B_{II}$ is equal to $n_1I_1+n_2I_2$ or $2\cdot½-1\cdot 1/\sqrt{2}$. Accordingly, the magnetic field range for this multi-coil design would be:

$$1-1/\sqrt{2}<B<\sqrt{3}$$

Case 3: $n_1=3n_2$

FIG. 3C shows a case for $n_1=3n_2$. Curve 325 shows the constant power curve for $n_1=3n_2$. It identifies values for $I_1$ and $I_2$ in relation to each other to maintain a constant normalized power of 1. Graph 327 shows the power, $P_{1cns}$, dissipated in the first coil section, and graph 329 shows the power, $P_{2cns}$, dissipated in the second coil.

The maximum magnetic field along the constant power curve 325 occurs if $I_2=I_1=½$. This corresponds to a magnetic field, $B_{II}$, $3\cdot½+1\cdot½$, which equals 2. Because $n_1$ has three times as many turns as $n_2$, coil $S_1$, without any constraints, would have a smaller maximum power density than $S_2$. Therefore, to comply with the criteria that the coil sections should have the same maximum power densities, their power densities are constrained to $D_{1max}$, (which is at $I_2=0$. Thus, the maximum power density for $S_1$ is $1/\sqrt{3}$. Therefore, the minimal magnetic field, $B_{II}$, occurs at $I_2=-1/\sqrt{3}$. This corresponds to $I_1$ equal to $1-⅓=⅔$. At this point, $B_{II}$ is equal to $n_1\cdot I_1+n_2I_2$ or $3\cdot\sqrt{⅔}-1\cdot 1/\sqrt{3}$. Accordingly, the magnetic field range for this multi-coil design is:

$$\cdot\sqrt{2}-1/\sqrt{3}<B<2, \text{ or } 0.83\ldots <B<2$$

From these cases, one can make the following conclusions. As the turn ratio $n_1/n_2$ increases, the power density range decreases, which is beneficial for temperature stability. Conversely, as the turn ratio $n_1/n_2$ increases, the magnetic field range decreases. This can be limiting but tolerable depending on the particular application.

Multi-coil Lens

Figure 4A:
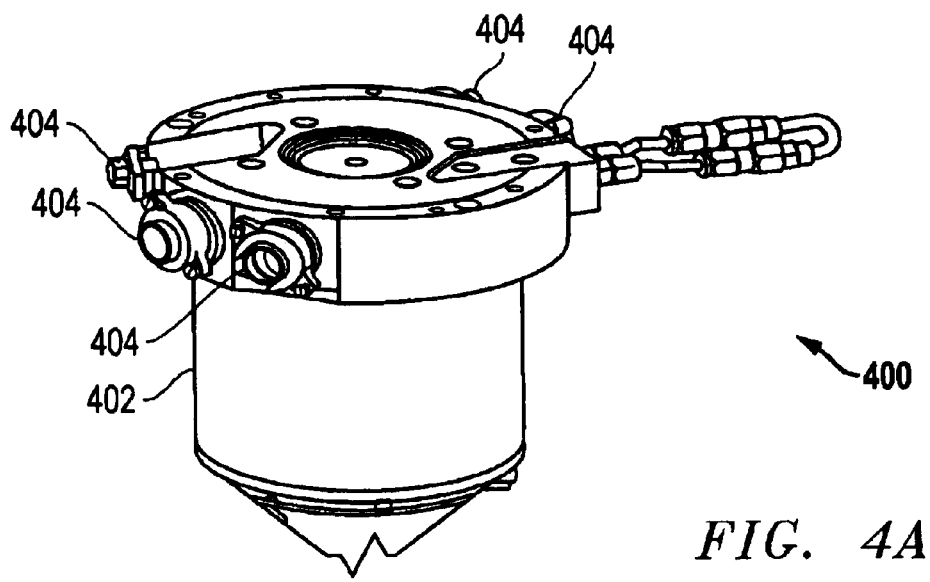
FIG. 4A is a perspective view of one embodiment of a multi-coil lens assembly of the present invention.

FIG. 4A shows one embodiment of a multi-coil lens housing 400, which includes a multi-coil lens assembly. Shown in this figure are housing casing 402 and input/output ports 404. The input and output ports 404 are used for providing power, control signal, and fluid connections to the multi-coil lens assembly and to a water-cooled heat dissipation mechanism used to dissipate heat away from the lens assembly.

Figure 4B:
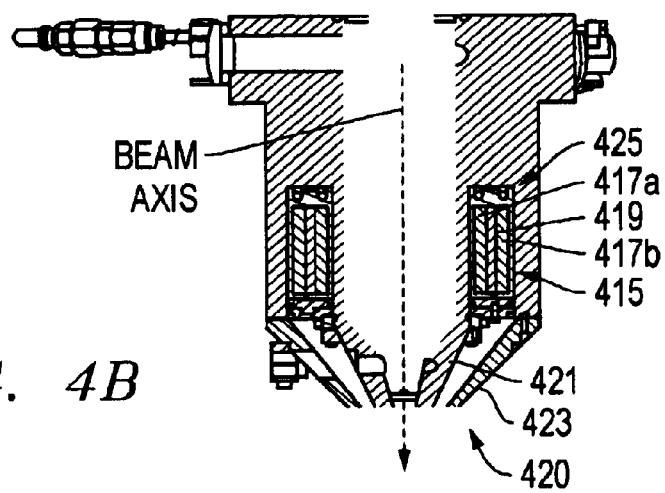
FIG. 4B is a cross-sectional view of the multi-coil lens of FIG. 4A highlighting the lens and pole assemblies.
Figure 4C:
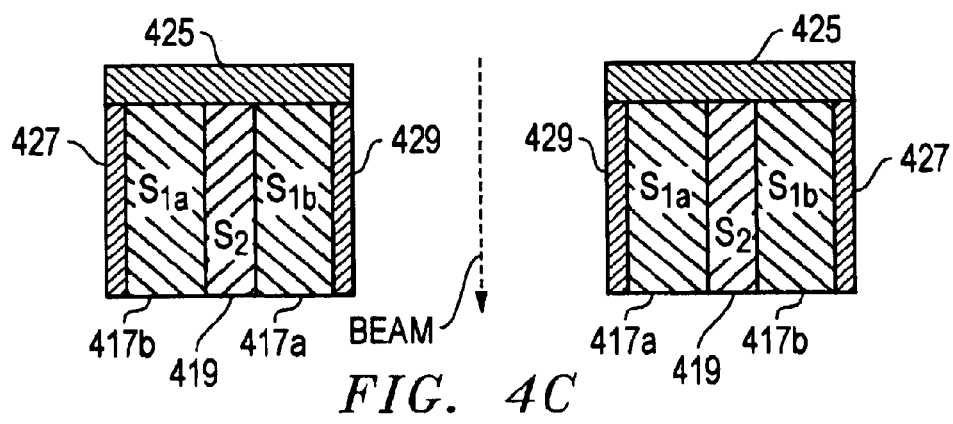
FIG. 4C is a block diagram of a coil assembly of the multi-coil lens of FIGS. 4A and 4B.

With reference to FIGS. 4B and 4C, cross-sectional views of the multi-coil lens assembly are shown. In the depicted embodiment, the multi-coil lens assembly comprises coil assembly 415, pole assembly 420, and coil cooling mechanism 425. The pole assembly 420 forms a collar around coil assembly 415 with an annular air gap at its lower portion to define a magnetic field ring for focusing an electron beam at the beam axis. Coil cooling mechanism 425 is mounted to the coil assembly 415 and pole assembly 420 to channel heat away from the coil assembly in order to improve thermal stability.

Coil assembly 415 comprises a bi-furcated primary coil section 417 ($S_1$) and a secondary (or dynamic) coil section 419 ($S_2$). Primary coil section 417 is formed from two sub-sections: inner coil section 417a ($S_{1a}$) and outer coil section 417b ($S_{1b}$). Secondary coil section 419 is sandwiched between outer primary section 417b and inner primary section 417a, which is nearest to the beam axis. The three coil sections: 417a, 417b, and 419 are concentrically wound about a common axis that corresponds to the beam axis. In this embodiment, they use the same type of wire with the same wire diameter. The coil construction is conventional, except that the winding process is interrupted to make connections to the coil sections. When the primary subsections 417a and 417b are wound with the same number of turns ($n_{1a}=n_{1b}$), the mean radius, $R_1=(r_{1a}+r_{1b})/2$, of cod section 417 equals $R_2$, the mean radius of secondary coil 419. When this is the case and when the same type of wire is used (as is the case here), the resistance per turn of each coil section, 417 and 419 will be substantially equivalent, as well. Under these conditions, the power densities (discussed above) become more relevant and when kept within an acceptable difference from one another, the coil section temperatures can be substantially close to one another, which is a desired condition. For the present invention, this is not required, but it increases the thermal stability of the lens and enhances its ability to maintain constant its temperature signature over the magnetic field strength operating range under the constant average power dissipation conditions discussed herein. With this design, a bi-coil assembly can be made thermally stable and at the same time, allow for different $n_1/n_2$ turns ratios.

Figure 1:
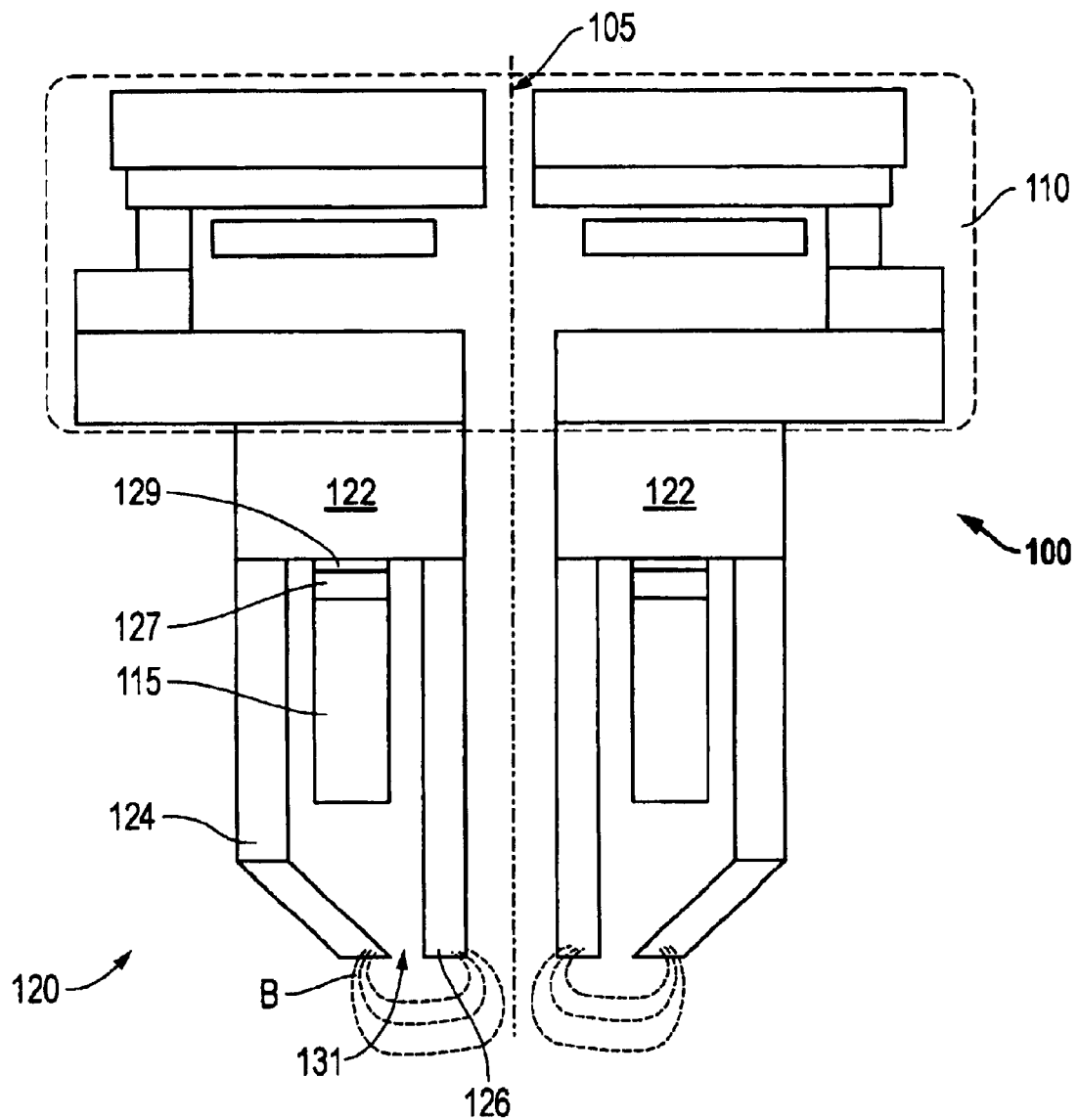
FIG. 1 is a cross-sectional, schematic view of a prior art magnetic lens.

Pole assembly 420 is similar to the pole assembly described in FIG. 1. It includes inner and outer pole pieces 421 and 423 to form a collar like structure about the "roll" shaped coil assembly 505. The pole section "collar" almost completely envelops the coil assembly 415 except at its underside where an air gap is formed to create the desired ring-shaped magnetic field pattern around the beam axis at the lower portion of the pole assembly 420. The pole pieces are made from a ferro-magnetic material to more efficiently conduct the magnetic flux and concentrate almost all of the generated mmf (magneto motive force) in the air gap.

The heat dissipation mechanism 425 comprises a water-cooling jacket and has outer and inner thermally conductive covers 427 and 429, respectively. The coil sections are surrounded by the inner and outer covers 427, 429 to reduce thermal resistance from the coil sections to the water cooled portion. In this embodiment, the heat dissipation mechanism 425 and covers 427, 429 are formed from a water-cooling jacket with copper side plates, but varieties of conventional heat dissipation structures will suffice, depending on the particular environment. Moreover, the heat dissipation mechanism 425 is not required, but it will generally improve operation by increasing the thermal stability of the lens, especially when it is designed to remove heat in accordance with the power generated by the coil assembly 415. This adds to its ability to maintain a substantially constant temperature signature under constant average generated power conditions.

EXAMPLE

In one application, a lens assembly is desired for handling beams ranging between 0.5 and 2 KeV. This generally requires a magnetic field, $B_{Hc}$, range of about t 2 or more. A lens design meeting these requirements has the following physical parameters:

| | |
|---|---|
| Total number of turns: | 1232 |
| Turns ratio, $n_{1a}:n_2:n_{1b}$ | 8:6:8 |
| Actual coil turns, $S_{1a}:S_2:S_{1b}$ | 448:336:448 |
| Diameter Cu wire: | 0.63 mm |
| Number of ampere turns | 1140 (A · t) |
| Total resistance | 18 Ω |
| Total dissipated power | ca 15.5 W |
| B range (normalized) | 0.64 < B < 1.915 |
| B range (actual) | 0.3546 < B < 2.82 |

-continued

| | |
|---|---|
| Current at the maximum magnetic field ($I_1 = I_2$) | 0.93 A |
| $I_{1max}$ | 1.085 A |
| $I_{2max}$ | −1.085 A |

With this design, the sectional turns ratio, $S1a:S_2:S_{1b}$, is 8:6:8, which translates to a primary-to-dynamic coil turns ratio, $N_1/N_2$, equal to 2.67. Since the inductance of each coil section is proportional to the number of turns squared, the inductance of $S_2$ is at $n_1 \approx 2.67 \cdot n_2$ is almost 1 order of magnitude less than the inductance of $S_1$.

Thus, besides having favorable magnetic field and power density ranges, this ratio is also well-suited for dynamic focusing (discussed below) because most of the current modulation can occur in the lower inductance, secondary coil 419, which is sufficiently responsive for modulating the dynamic signal at the field scan frequency.

Drive Circuit

FIG. 5 shows one embodiment of a circuit 500 for electrically driving coil sections 417a, 417b, and 419. Circuit 500 generally includes D-to-A converters 502A, 502B, 526A, 526B; analog summing amps 504, 524; analog difference amps 506, 522; 508, 514, 516; low-pass filters 509; coil sections 417a, 417b, 419; measuring resistors 510, 520; and feedback amplifiers 512 and 518. The circuit can be divided into two sections: one for driving the primary coil (417a, 417b) and the other for driving the secondary coil (419). The circuit for driving the primary coil 417 is initially discussed followed by a discussion of the circuitry for driving the secondary coil 419.

A digital command signal, $I_1$, is input to the primary coil driver section for controlling the amount of current driven through the primary coil. $I_1$ is composed of a course component, $I_{1course}$, which is input to the DAC 502A, and a fine component, $I_{1fine}$, which is input to DAC 502B. From these inputs, DACs 502A and 502B output analog command signal components that are summed together at analog summing amplifier 504, which generates an overall $I_1$ current command signal—the sum of $I_{1course}$ and $I_{1fine}$. From there, the overall $I_1$ current command signal is fed into differential amp 506 as one of its inputs. The other input is a feedback signal from feedback amp 512. Difference amp 506 subtracts the feedback signal from the $I_1$ current command signal and provides the resulting difference signal at its output.

The feedback signal is an amplified version of the voltage dropped across measuring resistor 510. Because resistor 510 is in series between coil sections 417a and 417b (the input impedance of feedback amp 512 is extremely high), the voltage across it corresponds directly to the current in the primary coil sections 417a, 417b. The gain of feedback amp 512 is set so that the feedback signal fed into differential amp 506 is appropriately comparable with the $I_1$ current command signal. Accordingly, while the $I_1$ command signal represents the desired primary coil current, the feedback signal corresponds to the actual, real-time primary coil current. Thus, the difference signal generated by differential amp 506 is a closed-loop, error signal that controls current drivers 508 and 514. The error signal causes the current drivers to force current through the primary coil sections in accordance with the value of command signal $I_1$.

Low-pass filters 509 are disposed in series between the current drivers 508, 514 and their associated primary coil sections 417a, 417b, respectively, In the depicted embodiment, they each include a choke 511 and a capacitor 513. Filters 509 (but primarily chokes 511) serve to counter the flyback voltages created by the primary coil, which are greater than those created in the secondary coil 419 because of its greater number of coil turns and thus higher inductance. Unfortunately, however, the external alternating, magnetic field from the secondary coil can induce a voltage in the chokes, which can cause undesired current to flow through the primary lens coil 417. To limit this problem, the following measures may be taken. A choke construction that is less sensitive such as a toroid can be used. Toroids are rather insensitive to in tangential external fields and are less sensitive than other designs in their radial directions. In addition, the disturbing external magnetic fields could also be diverted with a lower-reluctance shield or shunt such as an iron heatsink. For example, toroid chokes could be mounted on iron heatsink plates. Moreover, the use of separate, counteracting chokes can be employed. That is, they can be arranged so that their induced voltages are in opposite directions relative to their electrically conductive paths.)

Filters 509 each have a cut-off frequency sufficiently high (e.g >20 Hz.) to allow the primary coil current to be changed with reasonable responsiveness. Therefore, the values of chokes 511 and capacitors 513 should be set to meet this objective. In the depicted embodiment, the chokes 511 have an inductance that is about 10 times the inductance of primary coil 417.

The rest of circuit 500 controls the current in the secondary coil 419 in substantially the same way. Thus, it will not be discussed with as much detail. One difference, however, is that measuring resistor 520 is connected between coil section 419 and ground rather than being disposed between two coil sections. Because the input resistance to feedback amp 518 is very high, the resistor, in effect, is in series with coil section 419. Therefore, the voltage drop across resistor 520 accurately corresponds to the current in the secondary coil.

Accordingly, circuit 500 serves to accurately and independently control the currents in the primary and secondary (dynamic) coil sections in response to input digital command signals, $I_1$ and $I_2$. $I_1$ and $I_2$ may come, for example, from a controller or processor in the SEM. In one embodiment, they are controlled in accordance with the constant power constraints discussed above, with $I_1$ being uni-directional and $I_2$ being modulated for implementing dynamic focusing, as is discussed in the following section.

Dynamic Focusing

SEM microscopes are typically used for examining properties of semi-conductor wafers very accurately. However, in dual beam systems, the electron beam is not usually perpendicularly directed over the scan field on a sample to be scanned. Instead, it may be offset from the sample at an angle such as 45 degrees. (This is represented in FIGS. 6A and 6B.) This results in beam length differences from the beam source to the various points on the scan field being different from one point to another such that it introduces unacceptable errors if not compensated.

FIG. 6A schematically shows a side view of a SEM 605 projecting beam 607 onto a scan field of a sample 602. FIG. 6B shows a top view of the same taken along lines 6B—6B of FIG. 6A. AS shown in FIG. 6A, the beam length varies as it scans points in different locations along the Y-axis. The differences in beam distance $D_{beam}$ can vary from a minimal distance, $D_{min}$, to a maximum distance, $D_{max}$. For example, the beam length distance along the Y axis from one side to the other may vary up to 25 $\mu$m. As shown in FIG. 6B, the beam distance also varies along the X-axis from the center out to the edges, but this difference is not as dramatic. These beam length differences cause the beam to be out of focus for many of the points on a scan field.

The focus point deviations can be addressed in several ways. One can change the accelerating voltage, or alternatively, one can change the magnetic field strength in the objective lens. This latter method is known as dynamic focusing. It involves changing the magnetic field strength in real-time to compensate for beam length differences within each field scan. A dynamic signal with a shape and frequency corresponding to the beam length differences profile and scan field frequency is used. In one embodiment with the configuration of FIGS. 6A/B, a ramp (or saw tooth) function is used for the dynamic signal. The ramp signal is at its minimal value when the beam source is closest to the scan points. As the beam scans "up" along the scan field in the Y direction, the ramp signal increases in accordance therewith. The saw tooth signal is at its maximum when the beam is directed to points along the farthest end of the scan field. In this embodiment, the field is not adjusted for beam length differences along the X axis, but if desired, this of course could be done by modulating an appropriate second signal onto $I_2$ to account for these variations.

In one embodiment, using the driver circuit described above, the primary and secondary coil sections are driven in the following manner for implementing both constant average power and dynamic focusing. An adjustable DC current signal is input as $I_1$ for driving the primary coil 417, while $I_2$ comprises a periodically varying dynamic focusing component, $I_{2AC}$, modulated on an adjustable DC offset component, $I_{2DC}$ (which may be any value including negative values, positive values, and 0) for driving the secondary coil section 419. In one embodiment, when implementing both constant average power and dynamic focusing as described herein, the average total generated power is kept substantially constant, while the real-time power is not necessarily constant for any two points in time. That is, the value of $I_1$ is not changed in real-time according to a constant power function to compensate for the changes in $I_2$ attributable to its dynamic AC component because it is assumed that the dynamic component is "fast" enough such that the RMS (root mean squared) value of $I_2$ ($I_{2rms}$), can be used as a static $I_2$ value for a given field strength in setting $I_1$ and $I_2$ in adherence to the constant power function. In most cases, this is sufficient to maintain a substantially constant thermal signature throughout the lens assembly.

The coils in the magnetic lens should preferably have sufficiently low inductance that the magnetic lens can be dynamically focused at the desired scan rate. For example, if a scan rate sufficiently high to produce clear video images is desired, a lower inductance is required than that required for a lower scan rate. Various embodiments of the inventive lens can support dynamic focusing when the electron beam has a scan or frame rate of as great as, or greater than, approximately 15 Hz, approximately 20 Hz, approximately 25 Hz, or approximately 30 Hz, depending on the configuration. A preferred embodiment supports dynamic focusing at conventional TV scan rates, i.e., 30 Hz scan rate or greater. This means that the coil should be able to produce a 30 Hz saw-tooth current signal at sufficient current magnitudes and recovery intervals. It should be appreciated that supporting TV scanning does not mean that the lens coil assembly only has to be able to be responsive enough (sufficiently low reactance) to produce a generic 30 Hz AC signal. Saw-tooth signals require more responsiveness than other AC signals that do not have such abrupt transitions. With a saw-tooth, a certain amount of recovery time is needed to get the signal from its maximum value to its minimum value. (This corresponds to the fly-back part of the scan, which is the part where the beam returns back to the top of the scan frame.)

EXAMPLE

In an exemplary dual beam system (not shown), a multi-coil lens as described above has the following characteristics:

| | |
|---|---|
| Total number of turns: | 1232 |
| Turns ratio's $n_1:n_2:n_1$ | 8:6:8 |
| Ampere turns | 1140 At |
| Mean diameter | 80 mm |
| Dynamic focus requirement ($\Delta z_{focus}$): | ≈25 µm |
| $z_{focus}$ | ≈2.3 mm |

Moreover, the acceleration voltage of the electron beam in an SEM must be allowed to quickly changed (interruption less than one minute) over a range of operating voltages from 500V to 2 kV. For the same focus point, this results in a required change in magnetic field from 570 to 1140 amp-turns (a change of a factor of two), and hence a variation in dissipated power of a factor 4. These parameters were met by implementing the following measures.

Consistent with the lens of FIG. 4, a circular symmetric construction was employed. The objective coil was cooled with a water-cooling body having thermally conductive side covers, and it was insulated from the SEM housing. The constant power dissipation and constant power density techniques described above were also used. Likewise, a dynamic focusing saw tooth signal was driven into the secondary coil to account for a beam distance change of 20 µm (≈1% working depth of 2.3 mm). The nominal working distance is 2 mm.

For this exemplary case, current, voltage and coil inductance values are calculated using the above parameters in the following manner.

Number of turns section 2:

$$n_2 = (6/22) \cdot 1232 = 336$$

Estimated inductance for $L_2$:

$$L_2 = (A_{CLM} / A_{S-FEG}) \cdot (n_2 / n_{s-FEG})^2 \cdot L_{S-FEG}$$
$$= (r_{CLM} / r_{S-FEG})^2 \cdot (n_2 / n_{s-FEG})^2 \cdot L_{S-FEG}$$
$$= 124 \text{ mH}$$

The dynamic focus requirement:

$$\Delta z_{focus} \approx 25 \text{ µm}$$

and from the lens properties:

$$z_{focus} \approx 2.3 \text{ mm}$$

Calculation:

$$\Delta NI = (\Delta z_{focus}/z_{focus}) \cdot NI \approx (25 \text{ µm}/2.3 \text{ mm}) \cdot 1140 = 12.4 \text{ At}$$

Hence $$\Delta I_2 = \Delta NI / n_2 = 36 \text{ mA}_{pp}$$

With a frame saw tooth dynamic signal having a period of 30 ms and a 1:10 flyback ratio, the flyback voltage becomes:

$$\Delta V_2 = -L_2 \cdot \Delta I_2 / (t_{period}/10) \approx 1.5 \text{ V}_{pp}$$

When designing actual multi-coil lens assemblies with dynamic focusing, one may take into account the following additional considerations. An induced voltage from the primary lens coil counteracts the dynamic field as a result of Lentz' law. To reduce this effect, a choke (such as 511 above) can be disposed in series with the primary coil. Alternatively, one could use a high-quality current driver to drive the primary coil. It has been observed that the cooling ring (water-cooled jacket discussed above) did not significantly impair the dynamic field even though it was disposed in magnetic short circuit across the inner and outer poles. This, however, is not verified. One should take the cooling hardware into account as to how it affects the dynamic focusing for specific designs. Along these lines, use of inner and outer pole covers for decreasing thermal resistance decreases magnetic frequency response. It appears, however, that the use of holes in the covers will reduce this effect.

Although the present invention and its advantages have been described in detail, it should be understood that various changes, substitutions and alterations can be made herein without departing from the spirit and scope of the invention as defined by the appended claims. For example, the present invention is certainly not limited to a coil assembly with a bi-furcated primary coil section, inner-sandwiched second coil section, and the presented cooling mechanism. These are examples of structures for achieving a thermally stable lens with asymmetric coil sections that can maintain a substantially constant temperature signature under substantially constant average power conditions, but they are not required. From the teachings and suggestions herein, persons of skill will recognize different structures using combinations of techniques taught in this disclosure to achieve suitable thermal stability. Thus, as one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim:

1. A magnetic lens comprising:
   primary and secondary coil sections each having coil turns for generating additive magnetic fields thereby forming a resultant beam focusing field, the primary coil section having a larger number of coil turns than the secondary coil section, the sections being configured to have a substantially constant thermal signature when operated with their combined average generated power being substantially constant over an operational range of resultant field strengths;
   wherein the secondary coil section is sufficiently responsive for implementing dynamic focusing when it is driven with a dynamic focusing current.

2. The lens of claim 1 further comprising a choke connected in series with the primary coil section for countering adverse flyback voltage effects.

3. The lens of claim 1, wherein the primary coil section is divided into first and second coil sub-sections with the secondary coil section disposed between said first and second primary coil sub-sections.

4. The lens of claim 3, wherein the first and second primary coil sub-sections have substantially the same number of coil turns.

5. The lens of claim 1 further comprising a cooling body mounted at a common end of the primary and secondary coil sections.

6. The lens of claim 5, further comprising thermally conductive covers thermally connecting one or more areas of the coil sections to the cooling body.

7. The lens of claim 1, wherein the electrically conductive coil turns are implemented with wire.

8. The lens of claim 7, wherein the wire in the primary and secondary coil sections have substantially the same resistivity characteristics.

9. The lens of claim 1, wherein the ratio of coil turns in the primary coil section to turns in the secondary coil section is greater than or equal to 2 to 1.

10. The lens of claim 1, wherein the secondary coil section is sufficiently responsive for implementing dynamic focusing as the beam is scanned at approximately 30 Hz frame rate or greater.

11. A SEM having a multi-coil lens in accordance with the magnetic lens described in claim 1.

12. The method of claim 11, further comprising dynamically modulating a current signal for driving the second coil section to change the resultant field strength in accordance with changes in beam distance to a scan point.

13. The method of claim 12 in which the current is modulated by a sawtooth signal at approximately 30 Hz frame rate or greater.

14. The method of claim 11, wherein the first coil section is driven in only one direction, while the second section is driven in more than one direction.

15. The method of claim 11, wherein both the first and second coil sections are driven to have the same maximum allowed power densities.

16. The dual beam system of claim 15, wherein the charged particle column is offset from the holder at an angle thereby having different beam distances from the charged particle source to various scan points on the sample, the circuitry additionally driving the second coil section with a dynamic focusing current component to compensate for said beam length differences.

17. The system of claim 15, wherein the first coil section has first and second sub-section components sandwiched around the second coil section.

18. The system of claim 15, wherein the first and second coil section turns are at least partially bi-flair wound together.

19. The system of claim 15, wherein the charged particle column is a SEM.

20. A dual beam system having a controller for controlling a magnetic lens in an SEM, said controller accessible to instructions that when executed by the controller cause it to control the magnetic lens to produce a resultant beam focusing magnetic field in accordance with the method of claim 11.

21. A method for generating a beam focusing magnetic field in a SEM, comprising:

providing first and second coil sections configured to produce additive field components, the field components adding to form a resultant beam focusing field, wherein the first coil section has a larger number of coil turns than the second coil section;

driving the first coil section to generate the first section field component; and driving the second coil section to generate the second section field component, the second coil section being driven with an AC signal component, wherein the first and second coil sections are driven to (i) produce a desired resultant field strength from a range of available field strengths, and (ii) generate substantially the same total average power over the range of available field strengths thereby maintaining a sufficiently constant thermal signature in the coil sections to allow for the resultant field strength to be changed without requiring a delay for thermal stabilization.

22. A dual beam system having a charged particle column comprising:

a charged particle source assembly;

a holder for receiving a sample to be irradiated by said charged particle source;

a magnetic lens disposed between said charged particle source and said holder for focusing a charged particle beam emitted from said charged particle source, the magnetic lens including a first coil section having coil turns for generating a first section field component and a second coil section having coil turns for generating a second section field component, said coil sections being configured to produce a resultant beam focusing field that is the sum of said first and second section field components, wherein the first coil section has a greater number of turns than the second coil section resulting in the second coil section being more responsive than the first coil section; and circuitry connected to said first and second coil sections, said circuitry adapted to drive the first and second coil sections to generate a selected resultant beam focusing field from a range of available resultant fields, wherein the total average power produced by both coil sections is substantially constant throughout the range of available resultant fields, the coil sections being configured to have a substantially constant temperature signature throughout the coil sections when their total average power is substantially constant, wherein most current change in the coil sections for changing the resultant beam focusing field occurs in the second coil section.

* * * * *